US010629578B2

(12) United States Patent
Leisen et al.

(10) Patent No.: US 10,629,578 B2
(45) Date of Patent: Apr. 21, 2020

(54) ARRANGEMENT HAVING A CARRIER AND AN OPTOELECTRONIC COMPONENT

(71) Applicant: OSRAM OLED GmbH, Regensburg (DE)

(72) Inventors: Daniel Leisen, Regensburg (DE); Markus Pindl, Tegernheim (DE); Simon Jerebic, Donaustauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/329,821

(22) PCT Filed: Aug. 30, 2017

(86) PCT No.: PCT/EP2017/071711
§ 371 (c)(1),
(2) Date: Mar. 1, 2019

(87) PCT Pub. No.: WO2018/041865
PCT Pub. Date: Mar. 8, 2018

(65) Prior Publication Data
US 2019/0189605 A1   Jun. 20, 2019

(30) Foreign Application Priority Data
Sep. 1, 2016 (DE) .................. 10 2016 116 298

(51) Int. Cl.
*H01L 25/16* (2006.01)
*H01L 33/52* (2010.01)
(Continued)

(52) U.S. Cl.
CPC ........ *H01L 25/167* (2013.01); *H01L 31/0203* (2013.01); *H01L 33/52* (2013.01); *H01L 33/62* (2013.01)

(58) Field of Classification Search
None
See application file for complete search history.

(56) References Cited

U.S. PATENT DOCUMENTS 6,404,068 B1   6/2002   Tanaka et al.
8,885,127 B2   11/2014  Kanzaki et al.
(Continued)

FOREIGN PATENT DOCUMENTS

CN   1313882 A   9/2001
CN   1949487 A   4/2007
(Continued)

OTHER PUBLICATIONS

Notification of the First Office Action dated Aug. 22, 2019, of counterpart Chinese Application No. 2017800517984, along with an English translation.

*Primary Examiner* — Shaun M Campbell
(74) *Attorney, Agent, or Firm* — DLA Piper LLP (US)

(57) ABSTRACT

An arrangement includes a carrier; an optoelectronic component arranged on the carrier; and a material arranged on the carrier, wherein the carrier includes at least one structural element that hinders flow of the material in a flow direction, the structural element extends transversely to the flow direction, and the structural element has a rounding radius in a plane perpendicular to the transverse extent of the structural element less than 20 μm.

16 Claims, 5 Drawing Sheets

(51) Int. Cl.
    *H01L 33/62*     (2010.01)
    *H01L 31/0203*     (2014.01)

(56) References Cited

U.S. PATENT DOCUMENTS

| | | | |
|---|---|---|---|
| 2007/0029569 A1* | 2/2007 | Andrews | H01L 33/52 |
| | | | 257/99 |
| 2008/0029775 A1 | 2/2008 | Liu et al. | |
| 2008/0122123 A1 | 5/2008 | Pang | |
| 2012/0097985 A1 | 4/2012 | Liu et al. | |
| 2015/0016107 A1* | 1/2015 | Wimmer | H01L 33/60 |
| | | | 362/235 |
| 2015/0295153 A1* | 10/2015 | Kuramoto | H01L 33/56 |
| | | | 257/98 |
| 2017/0054061 A1* | 2/2017 | Naka | H01L 33/56 |

FOREIGN PATENT DOCUMENTS

| | | |
|---|---|---|
| CN | 102130235 A | 7/2011 |
| CN | 102939560 A | 2/2013 |
| DE | 197 55 734 A1 | 6/1999 |
| DE | 103 19 782 A1 | 11/2004 |
| EP | 2 538 462 A2 | 12/2012 |
| JP | 2008-021650 A | 1/2008 |
| JP | 4708755 B2 | 6/2011 |

\* cited by examiner

ARRANGEMENT HAVING A CARRIER AND AN OPTOELECTRONIC COMPONENT

TECHNICAL FIELD

This disclosure relates to an arrangement having a carrier and an optoelectronic component and a method of producing an arrangement having a carrier and an optoelectronic component.

BACKGROUND

It is known to arrange an optoelectronic component on a carrier. The optoelectronic component may be covered with an encapsulation compound. It is furthermore known to enclose the optoelectronic component with a frame. The interior of the frame is filled with the encapsulation compound, the encapsulation compound also covering the component.

There is nonetheless a need to provide an improved arrangement having a carrier and an optoelectronic component, and an improved method of producing the carrier having an optoelectronic component.

SUMMARY

We provide an arrangement including a carrier; an optoelectronic component arranged on the carrier; and a material arranged on the carrier, wherein the carrier includes at least one structural element that hinders flow of the material in a flow direction, the structural element extends transversely to the flow direction, and the structural element has a rounding radius in a plane perpendicular to the transverse extent of the structural element less than 20 µm.

We also provide a method of producing an arrangement having a carrier, including providing the carrier; introducing at least one structural element that hinders flow of a material in a predetermined flow direction into the carrier, wherein the structural element extends transversely to the flow direction, and the structural element has a rounding radius in a plane perpendicular to the transverse extent of the structural element less than 20 µm; arranging an optoelectronic component on the carrier next to the structural element; and applying the material onto at least one of the component and between the component and the structural element.

LIST OF REFERENCE SIGNS 1 carrier
2 electrically conductive layer
3 optoelectronic component
4 limiting element
5 flowable material
6 first side
7 second side
8 first contact region
9 second contact region
10 flow direction
11 first region
12 second region
13 structural element
14 elevation
15 depression
16 upper side
17 height
18 depth
19 rounding radius

DETAILED DESCRIPTION

One advantage of our arrangement is that flow of the material in a predetermined flow direction is hindered. This is achieved in that a surface structure of the carrier has at least one structural element in a predetermined flow direction. The structural element extends transversely to the flow direction. The structural element has a rounding radius in a plane of the flow direction of less than 20 µm. The plane is furthermore, for example, arranged perpendicularly to a longitudinal extent of the structural element. With these rounding radii, efficient impeding of the flow of the material is achieved. By the small rounding radius, wetting of the structural element with the flowable material is hindered or prevented.

At least three structural elements may be arranged successively in the flow direction, a structural element having a distance from the neighboring structural element which is less than 200 µm. At least three structural elements may therefore be arranged on a distance of approximately 400 µm.

At least three structural elements may be arranged successively in the flow direction. Neighboring structural elements may have a predetermined distance. For example, the distance of neighboring structural elements may be greater than 5 µm or less than 10 µm.

10 or more structural elements may be arranged successively in the flow direction, a structural element having a distance from the neighboring structural element of less than 200 μm and/or greater than 5 μm.

The size of the rounding radius may be greater than an average value of a surface roughness of the material, or an average roughness of the surface of the material in which the structural element is formed. The average roughness of the surface may, for example, be 2 μm or less. The structural element may have a width perpendicularly to a longitudinal extent of the structural element of at least three times the average surface roughness of the material in which the structural element is formed. The structural element may have a height, or a depth, which is at least three times the average surface roughness of the material in which the structural element is formed.

The structural elements may have the rounding radius of less than 20 μm along the entire longitudinal extent. Furthermore, the structural elements may in established sections have a rounding radius greater than 20 μm. The sections with rounding radii greater than 20 μm should not be arranged successively on an axis in the flow direction in neighboring structural elements, but should be arranged laterally offset. For example, a lateral distance between the sections of neighboring structural elements with rounding radii greater than 20 μm may be at least two times the distance between the neighboring structural elements. In this way, a sufficient retardation and/or limiting of a flow (bleeding) of the material can still be achieved.

The rounding radius may be less than 10 μm, in particular less than 5 μm. In this way, a further improvement of the flow impeding of the material is achieved.

The rounding radius may be less than 1 μm, in particular less than 0.05 μm.

The structural element may have a height greater than or equal to the rounding radius.

The structural element may have a height less than 20 μm. Because of the small height of the structural element, the surface structure of the carrier is essentially unchanged. Furthermore, flow of the material is hindered by the structural element in the predetermined flow direction. Therefore, for example, the optoelectronic component may be overfilled with a flowable material and lateral flow of the flowable material away in the predetermined flow direction is hindered or impeded because of the proposed surface structure with the structural element.

At least two structural elements may be arranged successively in the flow direction. The flow path of the flowable material is therefore reduced. Furthermore, defects in individual structural elements can be compensated for by a plurality of structural elements along the flow direction.

The structural elements are, for example, formed as elevations and/or as depressions. The structural elements may have a height less than 5 μm, in particular less than 1 μm. With the aid of these small heights of the structural elements as well, a substantial influence on the flow rate and the flow path of the flowable material can be achieved. In the example of the structural element as a depression, the depression has a width in the flow direction which corresponds to at least two times the rounding radius.

The carrier may comprise an electrically conductive layer, the structural elements being introduced in a surface of the electrically conductive layer. It is therefore not necessary to structure the carrier itself. The structural elements may, for example, already be produced during production of the electrically conductive layer. Furthermore, the structural elements may also be introduced into the surface of the electrically conductive layer after production of the electrically conductive layer. For example, the electrically conductive layer may be formed from a softer material than the carrier. Furthermore, the height of the structural elements may be equal to the height of the electrically conductive layer. It is therefore not necessary to configure the structural elements precisely with a height. The height may be automatically predetermined by the thickness of the electrically conductive layer itself. The electrically conductive layer may, for example, be electrolytically deposited. A roughness of the surface of the electrically conductive layer may occur during production or deposition of the electrically conductive layer. The structural elements may be introduced into the surface of the electrically conductive layer after production of the electrically conductive layer, for example, by an embossing method or a laser process or a grinding process or a scoring method or an etching method.

The structural elements may have a height of at least 0.1 μm. Tests have shown that this minimum height is advantageous for a substantial influencing of the flow rate and the flow length of the flowable material. The height of the structural elements should be greater than a roughness of the surface of the carrier.

A limiting element may be arranged next to the component on the carrier. The flowable material is arranged between the component and a first side of the limiting element. The structural elements are arranged adjacent to a second side of the limiting element. The second side is arranged opposite to the first side of the limiting element. The effect achieved in this way is that flowable material that, for example, flows through/between the limiting element and the carrier, is impeded from further flow by the structural elements on the second side of the limiting element. The limiting element may, for example, be configured in the form of a web extending over at least a part of the side lengths of the component, and in particular encloses the component annularly.

The structural elements may have an elongate shape or a round shape, in particular a circular shape, in a plane parallel to a surface of the carrier.

An elongate strip region may be provided, the structural elements being arranged in the strip region. The elongate strip region may be arranged with its longitudinal extent transverse to the flow direction. The longitudinal direction of the elongate structural elements may also be arranged perpendicularly to the predetermined flow direction. The predetermined flow direction corresponds to the direction in which the flowable material is not meant to flow. The structural elements may also have a shape curved in the plane of the carrier, in particular an S-shape. Furthermore, the structural elements may also be configured in the form of round, in particular circular, base faces in the surface of the carrier.

The structural elements may, for example, be produced with the aid of an embossing method and/or with the aid of a grinding method and/or with the aid of a laser processing method and/or with the aid of a mechanical scoring method and/or with the aid of an etching method and/or with the aid of a sandblasting method.

After application of the flowable material onto the carrier, depending on the material property, the flowable material is cured after a predetermined waiting time.

The flowable material may comprise a matrix material into which particles are introduced. For example, silicone may be used as a matrix material. Furthermore, in particular, scattering particles or luminescent particles may be used as particles. Furthermore, the flowable material may also comprise epoxide or plastic.

The elevations may be made of the same material as the carrier or the electrically conductive layer. Furthermore, the elevations may also consist of a different material.

The above-described properties, features and advantages, and the way in which they are achieved, will become more clearly and readily comprehensible in conjunction with the following description of examples, which will be explained in more detail in connection with the drawings.

Figure 1:
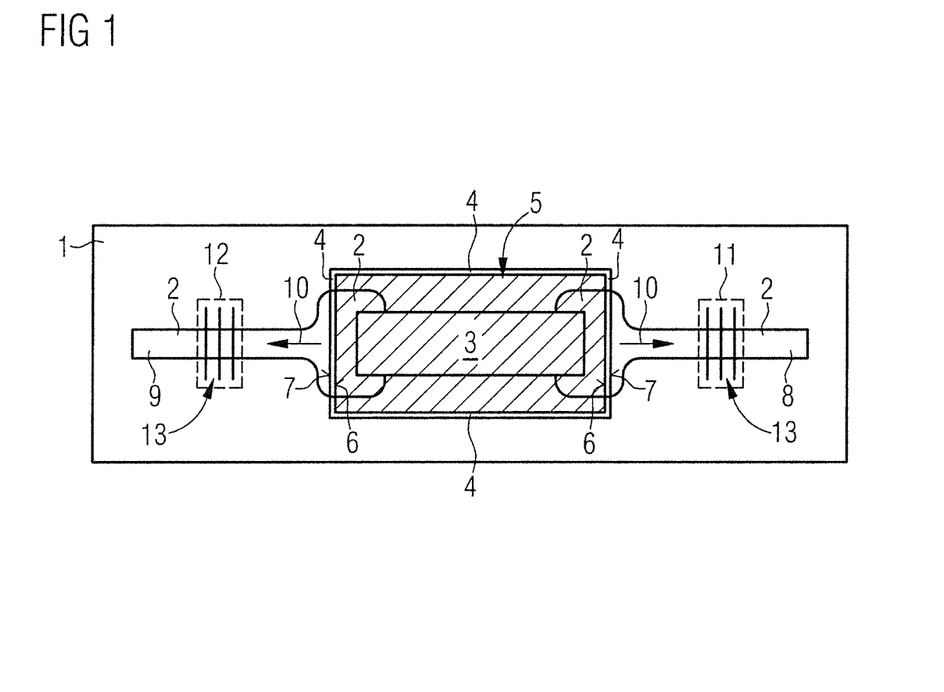
FIG. 1 schematically shows a plan view of the carrier.

FIG. 1 shows a plan view of an upper side of the carrier 1. The carrier 1 comprises two electrically conductive layers 2 arranged at a distance from one another on the upper side of the carrier 1. Furthermore, an optoelectronic component 3 is arranged on the upper side of the carrier 1. The component 3 comprises electrical terminals on a lower side that electrically conductively connect to the two electrically conductive layers 2. The optoelectronic component 3 is configured, for example, as a light-emitting diode, a laser diode or a photosensor. The electrically conductive layers 2 are applied as thin metallization layers on the upper side of the carrier 1. A limiting element 4 is furthermore provided, encloses the component 3 in the form of a circumferential frame and is arranged on the upper side of the carrier 1. Furthermore, a flowable material 5 is arranged inside the limiting element 4. The material 5 is represented schematically by oblique slashes and adjoins a first side 6 of the limiting element 4. The first side 6 represents an inner side facing toward the component 3, of the limiting element 4. Opposite to the first side 6, the limiting element 4 comprises a second side 7. The electrically conductive layers 2 extend away starting from the component 3 and respectively have a contact region 8, 9 at a distance from the component 3 and the limiting element 4.

The contact region 8, 9 of the electrically conductive layers 2 is intended for electrical contacting with a further electrical line, for example, for a bonding wire or a bonding ball. The contact regions 8, 9 are intended to be kept free of the flowable material 5. The flowable material 5 is therefore not intended to be able to flow in the direction of the contact regions 8, 9 after application onto the component 3 or adjacent to the component 3. The limiting element 4 is provided to limit the flow path of the material. On the one hand, the limiting element 4 may be omitted and, on the other hand, tests have shown that, in the event of poor adhesion of the limiting element 4 on the upper side of the carrier 1 or on the electrically conductive layer 2, flowable material 5 can flow between the carrier 1 and the limiting element 4 in a flow direction 10 in the direction of the contact regions 8, 9. The flow direction 10 is in this example a freely selectable direction in which flow of the material 5 is intended to be prevented.

To limit the flow path and the flow distance of the flowable material 5, the carrier 1 comprises a first and/or a second region 11, 12, which are represented as bordered by a dashed line. In the first and in the second region 11, 12, structural elements 13 that hinder or impede flow of the flowable material in the flow direction 10 are provided on the carrier 1 and/or on the conductive layers 2. The flow direction 10 is represented schematically as an arrow.

In the plane of the flow direction 10 and perpendicularly to the longitudinal extent of the structural elements 13, the structural elements 13 have a rounding radius less than 20 µm. The rounding radius may be less than 10 µm, in particular less than 5 µm. Furthermore, the rounding radius may be less than 1 µm, in particular less than 0.05 µm.

The structural elements 13 have, for example, a height less than 20 µm. The structural elements 13 are indicated only schematically in FIG. 1. The structural elements 13 may represent elevations and/or depressions. For example, the structural elements 13 may have a height less than 20 µm, and in particular less than 5 µm. The structural elements may have a height of less than 1 µm. The height of the structural elements should be greater than the rounding radius. The height of the structural elements should be greater than 0.1 µm, and in particular greater than a roughness of the surface of the carrier and/or of the surface of the electrically conductive layer 2. For example, an average roughness may be used as the surface roughness or roughness. The average roughness indicates the average distance of a measurement point (on the surface) from a midline. The midline intersects the actual profile within the reference distance such that the sum of the profile deviations in relation to the midline is minimal.

The length of the structural elements 13 transversely to the flow direction 10 may be significantly greater than a width of the structural elements 13 in the flow direction 10. The longer the structural elements 13, the better the flowable material is deflected laterally with respect to the flow direction 10. The structural elements 13 form as elevations barriers, and as depressions free filling regions for the flowable material 5.

The structural elements 13 may be produced by an embossing method and/or a grinding method and/or a laser processing method and/or a mechanical scoring method and/or an etching method and/or a sandblasting method.

The flowable material 5 may, for example, comprise adhesive material, silicone, epoxide, plastic, polymers or other types of materials that can be applied in paste or liquid form onto the carrier 1. Flowable is also meant to mean a paste-like material having a certain flowability. The flowable material 5 remains flowable at least for a certain period of time after application onto the carrier 1. Subsequently, it is at least partially cured and at least partially, in particular fully solid and no longer flowable.

The material 5 may also remain flowable in the longer term after application onto the carrier 1. Furthermore, the flowable material 5 also comprises materials that cure and solidify after a predetermined period of time after application. Nevertheless, limiting of the flow path by the structural elements 13 also offers advantages for a curable material 5 since the curable material 5 may also flow in the flowable state in the direction of the contact regions 8, 9 to be kept free. The limiting element 5 may, for example, be formed from a plastic material, epoxy resin or silicone. The structural elements 13 are represented schematically in FIG. 1 in the form of lines. In FIG. 1, the structural elements 13 are arranged at least partially in the region of the electrically conductive layers 2 and in the region of the surface of the carrier 1.

Figure 2:
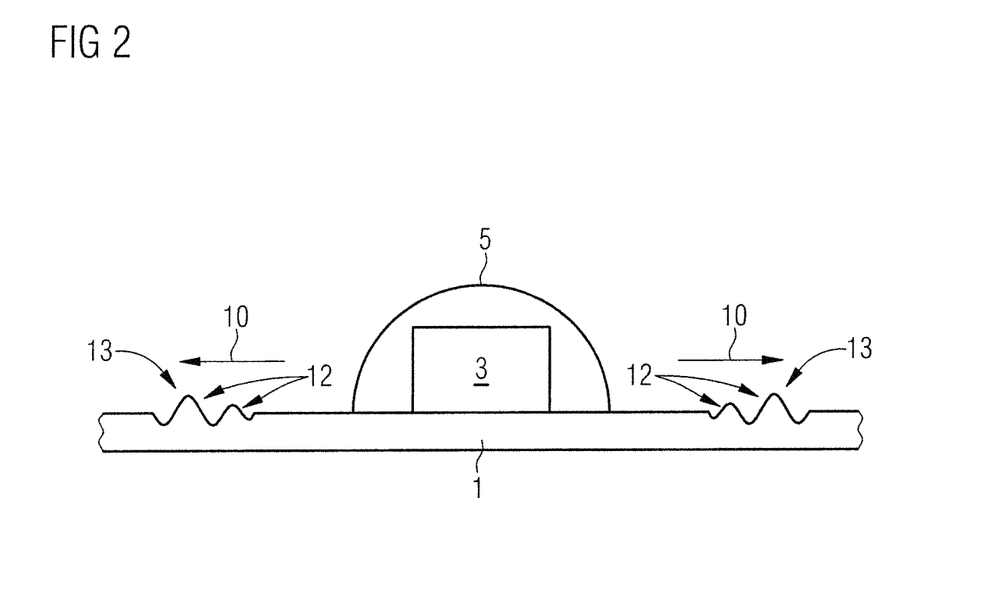
FIG. 2 schematically shows a cross section through a second example of the carrier.

FIG. 2 shows a schematic cross section through a further carrier 1 on which an optoelectronic component 3 is arranged. The component 3 is furthermore covered with flowable material 5. Furthermore, flow directions 10 in which a flow path of the material 5 is intended to be limited, are represented schematically in the form of arrows. On the upper side, the carrier 1 comprises structural elements 13 that hinder or impede flow of the flowable material 5 in the flow direction 10. In the plane of the flow direction 10 and perpendicularly to the longitudinal extent of the structural elements 13, the structural elements 13 have a rounding radius less than 20 µm. The rounding radius may be less than 10 µm, in particular less than 5 µm. Furthermore, the rounding radius may be less than 1 µm, in particular less than 0.05 µm. The structural elements 13 have, for example, a height less than 20 µm. The structural elements 13 are indicated only schematically in FIG. 1. The structural elements 13 may represent elevations and/or depressions. For example, the structural elements 13 may have a height less than 20 µm, and in particular less than 5 µm. The structural elements may have a height less than 1 µm. The height of the structural elements should be greater than the rounding radius, for example, greater than 0.1 µm, and in particular greater than a roughness of the surface of the carrier and/or of the surface of the electrically conductive layer 2.

Figure 3:
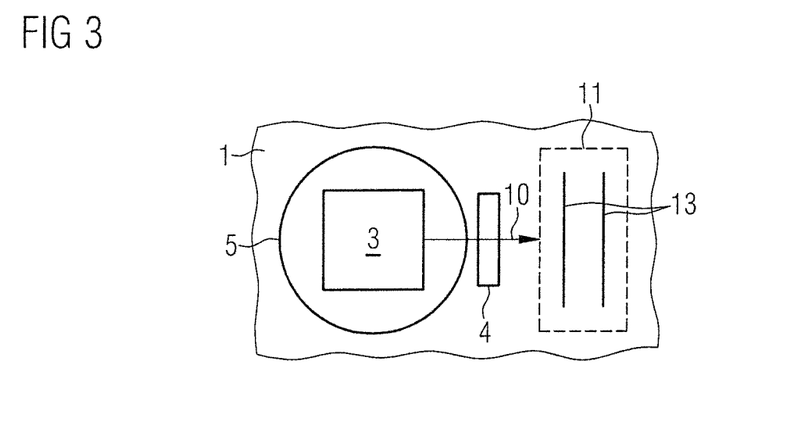
FIG. 3 schematically shows a plan view of a carrier with elongate structural elements.

FIG. 3 shows in a schematic representation a view of an upper side of a further carrier 1, a component 3 covered with flowable material 5 being arranged on the carrier 1. Flow of the flowable material 5 is intended to be prevented or at least limited in a flow direction 10, which is represented with an arrow. To this end, on the upper side, the carrier 1 has a first region 11 in which at least two, in particular a plurality of elongate structural elements 13 are provided. The longitudinal direction of the structural elements 13 is arranged perpendicularly to the flow direction 10. Furthermore, the at least two structural elements 13 represented are arranged successively at an established distance in the flow direction 10. A limiting element 4, for example, in the form of a web or a wall, may be provided between the component 3 and the first region 11.

Figure 4:
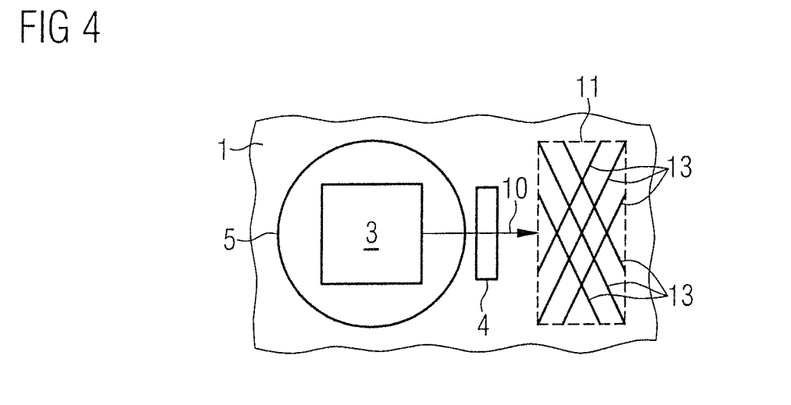
FIG. 4 schematically shows a plan view of a carrier with elongate structural elements arranged transversely to a flow direction.

FIG. 4 shows another example of a carrier 1 on which an optoelectronic component 3 covered with flowable material 5 is arranged. In this example as well, a limiting element 4 in the form of a web or a wall may be arranged next to the component 3 in the flow direction 10. The limiting element 4 may, however, also be omitted. In this example, elongate structural elements 13 are arranged transversely to the flow direction 10 in a first region 11. This orientation of the structural elements 13 in relation to the flow direction 10 also limits the flow path of the material 5. Furthermore, as represented in FIG. 4, crosswise-arranged elongate structural elements 13 may also be provided.

Figure 5:
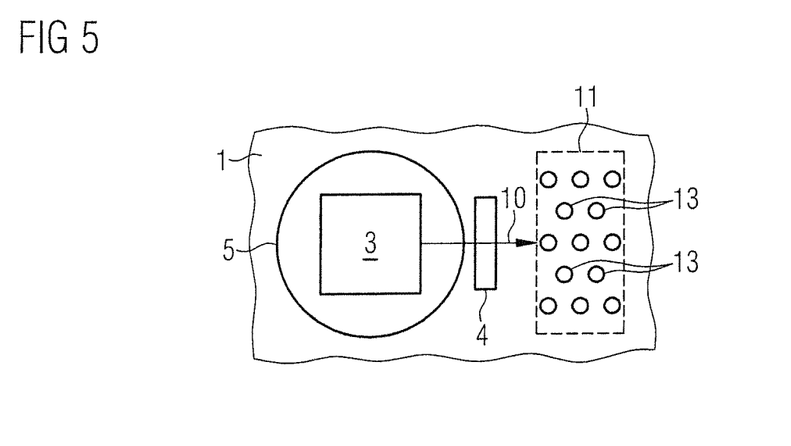
FIG. 5 schematically shows a plan view of a carrier with round structural elements.

FIG. 5 shows a partial detail of an upper side of a further carrier 1, on which a component 3 with flowable material 5 is arranged. Furthermore, a flow direction 10 in which flow of the flowable material 5 is intended to be limited is represented with an arrow. To this end, a first region 11 arranged in the flow direction 10 is provided with round structural elements. The first region 11 is indicated by dashed lines. For example, the first region is configured to be elongate and arranged transversely, in particular perpendicularly to the flow direction 10. In the plane of the carrier, the structural elements 13 have rounded base faces, for example, circular base faces. Furthermore, a limiting element 4 may be provided in the flow direction 10 between the first region and the component 3. In the example of FIG. 5 as well, at least two structural elements 13 are arranged successively in the flow direction 10.

The structural elements 13 of the preceding figures may, for example, be configured in the form of depressions and/or elevations. The arrangement of the structural elements 13 may represent a dimple structure. In the plane perpendicular to the surface 16 of the carrier, the depressions may have a rounding radius 19 less than 20 µm, and preferably greater than a roughness of the surface 16 of the carrier 1. Furthermore, the depth 18 of the depression may be greater than the rounding radius 19. Furthermore, a width of the depression along the flow direction 10 may lie in the range of the value of the depth 18. The structural elements 13 of FIG. 5 may also be arranged in electrically conductive layers.

Figure 6:
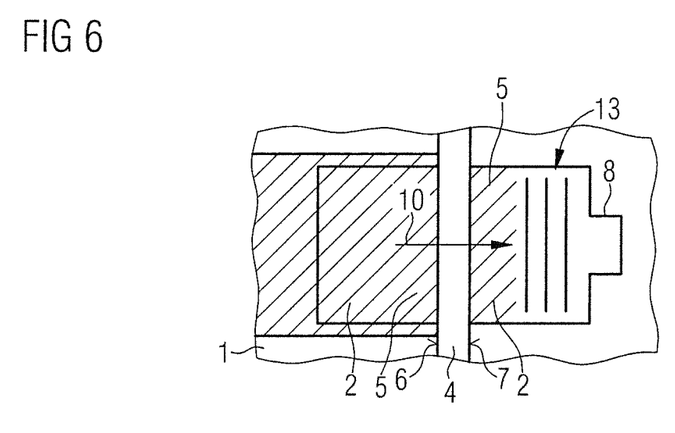
FIG. 6 schematically shows a partial detail of a carrier with a limiting element.

FIG. 6 shows a partial detail of a plan view of a further carrier 1 with an electrically conductive layer 2 on which a limiting element 4 is arranged. Furthermore, a flow direction 10 is represented schematically in the form of an arrow. The flowable material 5, represented schematically with oblique strokes, is in this example arranged on the electrically conductive layer 2 next to a first side 6 of the limiting element 4. The limiting element 4 is intended to limit a flow of the flowable material 5 directed in the flow direction 10. However, cavities between the carrier 1 and the limiting element 4 may ensure that flowable material 5 flows between the carrier 1 and the limiting element 4 in the flow direction 10 on a second side 7 of the limiting element 4, the flowable material 5 being schematically represented with oblique strokes as being adjacent to the second side 7. So that further flow of the material 5 in the flow direction 10 is hindered or limited, structural elements 13 are arranged next to the second side 7 of the limiting element 4 on the electrically conductive layer 2. The structural elements 13 may in addition also be arranged on the carrier 1. The structural elements 13 may be introduced only in the electrical layer 2 and/or only also in the upper side of the carrier 1. In this way, for example, wetting of a first contact region 8 of the electrically conductive layer 2 or other regions is intended to be prevented.

In the examples of FIGS. 3 to 6 as well, the structural elements 13 have a rounding radius less than 20 µm in the plane of the flow direction 10 and perpendicularly to the longitudinal extent of the structural elements 13. The rounding radius may be less than 10 µm, in particular less than 5 µm. Furthermore, the rounding radius may be less than 1 µm in particular less than 0.05 µm. The structural elements 13 have, for example, a height less than 20 m. The structural elements 13 may represent elevations and/or depressions. For example, the structural elements 13 may have a height less than 20 µm, and in particular less than 5 µm. The structural elements may have a height of less than 1 µm. The height of the structural elements should be greater than the rounding radius, for example, greater than 0.1 µm, and in particular greater than a roughness of the surface of the carrier and/or of the surface of the electrically conductive layer 2.

The structural elements 13 may comprise various shapes and various materials. Various shapes of the structural elements 13 will be explained below by way of example.

Figure 7:
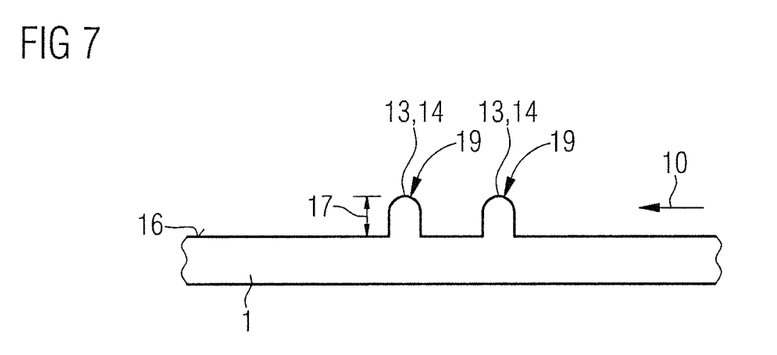
FIG. 7 schematically shows a cross section through a part of a carrier with structural elements in the form of elevations.

FIG. 7 shows a schematic partial cross section through a carrier 1 on which structural elements 13 in the form of elevations are represented in the flow direction 10. The elevations may, for example, be produced by applying material onto the carrier 1. The material may, for example, consist of the same material as the electrically conductive layer 2. Furthermore, silicone, epoxide or other materials may also be used as a material for the elevations 14. A height 17 of the elevation 14 relative to the upper side 16 of the carrier 1 may be less than 20 µm and greater than 0.1 µm. In the plane of the flow direction 10 and perpendicularly to the longitudinal extent of the elevations 14 transversely to the flow direction, i.e., in the section plane represented, the elevations 14 have a rounding radius 19 less than 20 µm. The rounding radius 19 may be less than 10 µm, in particular less than 5 µm. Furthermore, the rounding radius 19 may be less than 1 µm, in particular less than 0.05 µm. The elevations 14 have, for example, a height less than 20 µm. For example, the elevations 14 may have a height less 10 µm, and in particular less than 5 µm. The elevations 14 may have a height of less than 1 µm. The height of the elevations 14 should be greater than the rounding radius, for example, greater than 0.1 µm, and in particular greater than a roughness of the surface of the carrier and/or of the surface of the electrically conductive layer 2.

Figure 8:
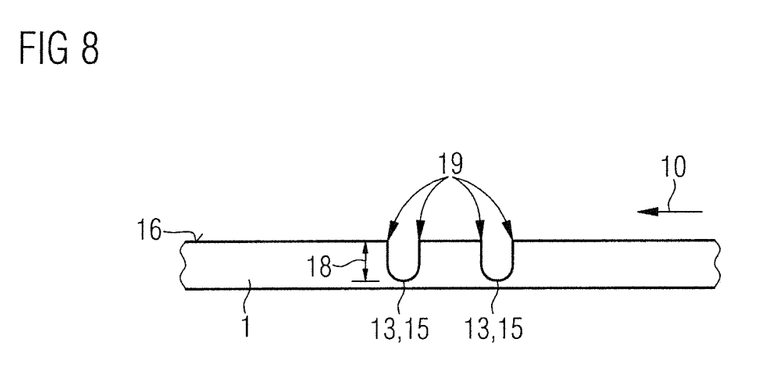
FIG. 8 schematically shows a cross section through a part of a carrier with structural elements in the form of depressions.

FIG. 8 shows a partial cross section through a further example of a carrier 1, in the upper side of which depressions 15 are introduced as structural elements. The depths 18 of the depressions 15 relative to the upper side 16 may be less than 20 µm and greater than 0.1 µm. In the plane of the cross section represented, at the transition to the surface 16 of the carrier, the depressions 15 may have a rounding radius 19 less than 20 µm and preferably greater than a roughness of the surface 16 of the carrier 1. Furthermore, the depth 18 of the depression 15 may be greater than the rounding radius 19. Furthermore, a width of the depression 15 along the flow direction 10 may lie in the range of the value of the depth 18. Furthermore, the width of the depression may have at least two times the value of a rounding radius 19.

In the plane of the flow direction 10 and perpendicularly to the longitudinal extent of the structural elements 13, the depressions 15 have a rounding radius 19 less than 20 µm. The rounding radius 19 may be less than 10 µm, in particular less than 5 µm. Furthermore, the rounding radius 19 may be less than 1 µm, in particular less than 0.05 µm. The depressions 15 have, for example, a depth less than 10 µm. For example, the depressions 15 may have a depth less than 20 µm, and in particular less than 5 µm. The depressions 15 may have a depth of less than 1 µm. The depth of the depressions 15 should be greater than the rounding radius, for example, greater than 0.1 µm, and in particular greater than a roughness of the surface of the carrier and/or of the surface of the electrically conductive layer 2.

Figure 9:
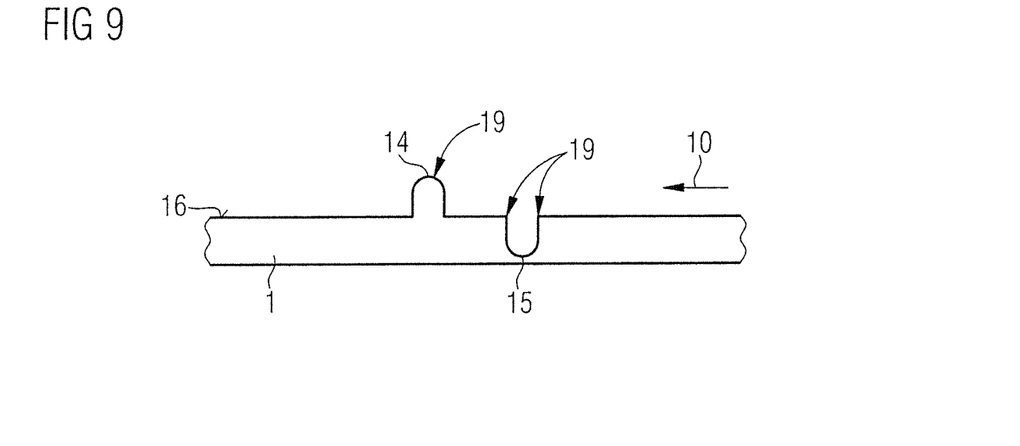
FIG. 9 schematically shows a cross section through a part of a carrier with structural elements in the form of elevations and depressions.

FIG. 9 shows a partial cross section through a further example of a carrier 1 on the upper side of which an elevation 14 is arranged and in the upper side of which a depression 15 is introduced. The elevation 14 and the depression 15 are provided successively as structural elements in the flow direction 10. The elevation 14 and the depression 15 may be configured according to the examples of FIGS. 7 and 8.

Figure 10:
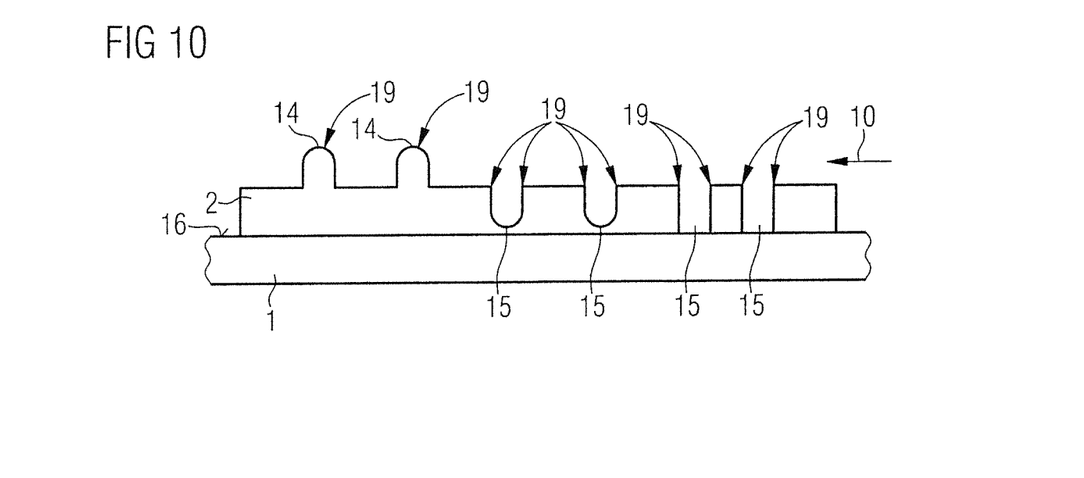
FIG. 10 schematically shows a cross section through a part of a carrier with an electrically conductive layer with structural elements.

FIG. 10 shows in a schematic partial cross section a further example of a carrier 1 in which elevations 14 and depressions 15 are introduced in an electrically conductive layer 2 in the flow direction 10. In the example, two types of depressions 15 are provided. One group of depressions 15 is formed as far as the upper side 16 of the carrier 1. A further group of depressions 15 extends only as far as a part of the thickness of the electrically conductive layer 2, and is not formed as far as the carrier 1. Formation of the depressions 15 as far as the surface 16 allows a simple production method and furthermore a defined depth of the depression 15 corresponding to the thickness of the electrically conductive layer 2. Only elevations or only depressions may be provided as structural elements in the electrically conductive layer 2. Furthermore, more than respectively only two elevations and/or only two depressions may be formed in the electrically conductive layer 2. The elevation 14 and the depression 15 may be configured according to the examples of FIGS. 7 and 8.

Figure 11:
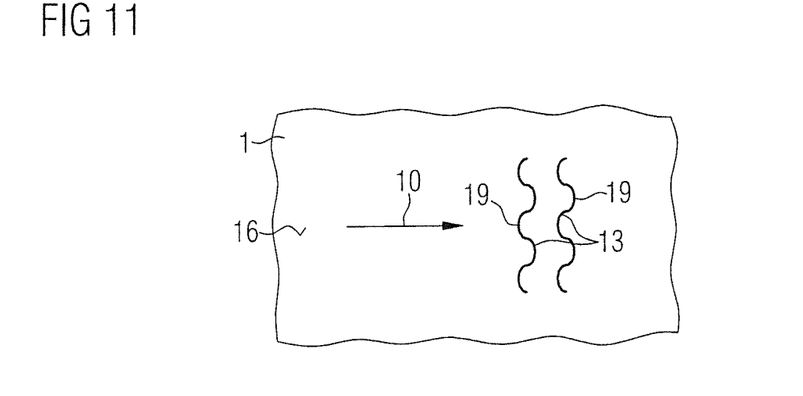
FIG. 11 schematically 6 shows a plan view of a surface of a carrier with corrugated structural elements.

FIG. 11 shows a partial detail of an upper side 16 of the carrier 1 in which curling structural elements 13 are represented transversely to the flow direction 10. The curling structural elements 13 may be configured in the form of elevations and/or in the form of depressions. The elevations and/or the depressions may be configured with rounding radii 19 and heights or depths according to the preceding examples.

Figure 12:
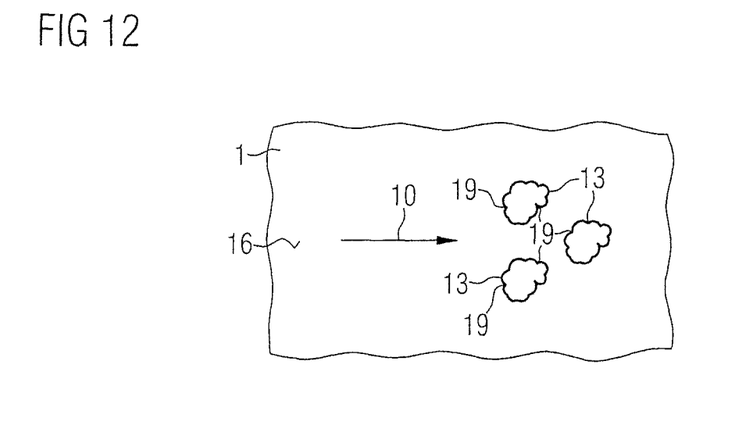
FIG. 12 schematically shows a plan view of a surface of a carrier with rounded structural elements.

FIG. 12 shows a partial detail of an upper side 16 of a carrier 1 in which structural elements 13 having a rounded base face in the plane of the upper side 16 of the carrier 1 are arranged in the flow direction 13. The base face of the structural elements 13 may be circular. The base face of the structural elements 13 may also comprise any other type of rounded base. In this examples as well, at least two structural elements 13 are arranged on the upper side 16. Structural elements 13 with different shapes may, for example, be arranged like the structural elements of FIGS. 6, 11 and 12, but also in a mixed fashion. Furthermore, the structural elements 13 may be arranged both on the upper side of the carrier 1 and also in the electrically conductive layer 2. The structural elements 13 may be configured as elevations and/or as depressions and have rounding radii 19 and heights and depths according to the examples described above.

In FIGS. 7 to 12, the representation of the component 3, of the flowable material 5 and of the limiting element 4 has been omitted.

Figure 13:
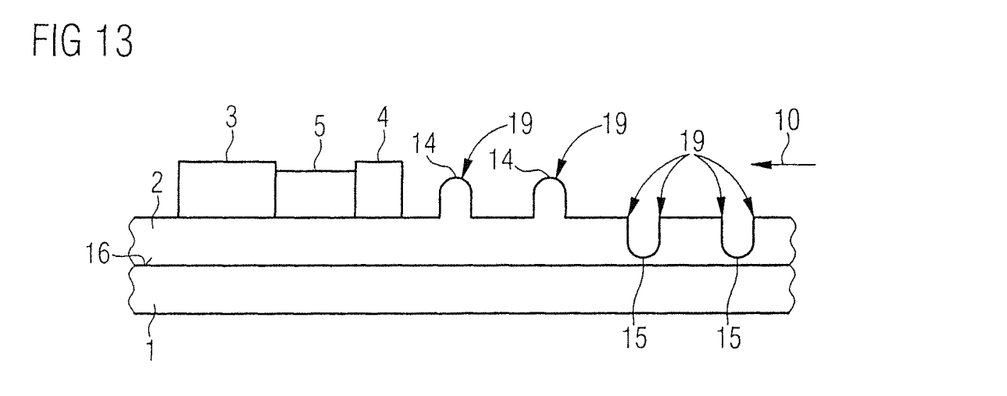
FIG. 13 schematically shows a partial cross section through a carrier with a component, a limiting element and an electrically conductive layer.

FIG. 13 shows a schematic partial cross section through a further example of a carrier 1, on the upper side 16 of which an electrically conductive layer 2 is arranged. Next to the component 3, a limiting element 4 is arranged on the electrically conductive layer 2. Between the component 3 and the limiting element 4, a flowable material 5 is provided on the electrically conductive layer 2. The material 5 may also cover the component 3. Furthermore, the limiting element 4 may also annularly enclose the component 3. Next to the limiting element 4, elevations 14 and depressions 15 are introduced as structural elements into an upper side of the electrically conductive layer 2 in a flow direction 10.

It is also possible to provide only one elevation and one depression in the flow direction 10. In addition, it is also possible to provide only two or more elevations 14 in the flow direction. Furthermore, it is also possible to provide only two or more depressions 15 in the flow direction.

The structural elements of the various examples have a height that, for example, may be less than 20 µm and greater than 0.1 µm.

The structural elements 13, the depressions 15 and/or the elevations 14 of the preceding figures may be configured both as elongate structures in the form of trenches, grooves, waves or in the form of circular structures, for example, recesses or humps or pins.

The structural elements 13, the depressions 15 and/or the elevations 14, have rounding radii 19 and/or heights and/or depths according to the examples described above.

In FIGS. 1, 3 to 6, 11 and 12, the rounding radii 19 are preferably arranged in a plane perpendicular to the sheet plane represented and in the flow direction 10.

Figure 14:
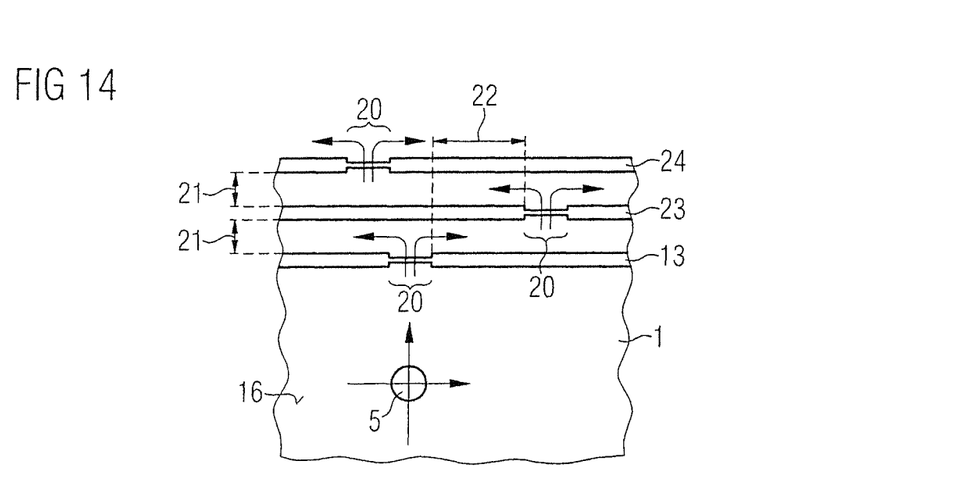
FIG. 14 schematically shows a partial detail of a carrier with a flowable material and with three structural elements.

FIG. 14 shows a partial detail of an upper side 16 of a carrier 1, a flowable material 5 being applied onto the upper side 16 of the carrier 1. At a predetermined distance from the material 5, a structural element 13 is arranged on the carrier 1. The structural element 13 has a longitudinal extent and is configured in a straight line. At a distance 21 perpendicularly to the longitudinal extent of the structural element 13, a second structural element 23 is arranged. The second structural element 23 has a longitudinal extent and is configured in a straight line. The second structural element 23 is arranged parallel to the structural element 13. At a distance 21 perpendicularly to the longitudinal extent of the second structural element 23, a third structural element 24 is arranged. The third structural element 24 has a longitudinal extent and is configured in a straight line. The third structural element 24 is arranged parallel to the second structural element 23. More or fewer structural elements 13, 23, 24 may be arranged. Furthermore, the structural elements may have different shapes and/or different distances 21 from one another.

The structural elements 13, 23, 24 have rounding radii perpendicularly to the longitudinal extent that are less than 20 μm. In addition, the rounding radii may be greater than an average roughness of the surface 16 of the carrier 1. Furthermore, the structural elements 13, 23, 24 comprise sections 20 in which the rounding radius perpendicular to the longitudinal extent is greater than 20 μm. The sections 20 of neighboring structural elements 13, 23, 24 are, however, arranged laterally offset by a distance 22 as seen along an axis perpendicularly to the longitudinal extent of the structural elements 13, 23, 24. The distance 22 may preferably be twice as large as a distance 21 between adjacent structural elements 13, 23, 24. With this arrangement of the structural elements 13, 23, 24 as well, flow of the material 5 perpendicularly to the orientation of the longitudinal extent of the structural elements is therefore hindered or impeded. The material 5 will flow over the structural elements 13, 23, 24 according to the arrows in the sections 20 and then respectively flow on laterally.

The sections with rounding radii greater than 20 μm are not arranged successively on an axis in the flow direction in neighboring structural elements, but are arranged laterally offset along the longitudinal extent of the structural elements. For example, a lateral distance between two sections of neighboring structural elements with rounding radii greater than 20 μm may be at least two times the distance between the neighboring structural elements perpendicularly to the longitudinal extent of the structural elements. In this way, a sufficient retardation and/or limiting of a flow (bleeding) of the flowable material can still be achieved. The structural elements 13, 23, 24 may, for example, be configured as webs or as recesses. Furthermore, the structural elements 13, 23, 24 may also have different shapes as described, for example, in the other examples. In the example of FIG. 14, the surface 16 of the carrier 1 may also be formed from an electrically conductive layer into which the structural elements 13, 23, 24 are introduced.

The electrically conductive layers 2 described in all the examples may have a layer thickness, for example, of 50 μm or less. The electrically conductive layers 2 may, for example, consist of a metal.

The material 5 described in all the examples may be configured as a flowable material or as at least partially or fully cured material.

In all the examples, at least three or at least ten structural elements may be arranged successively in the flow direction, a structural element having a distance from the neighboring structural element less than 200 μm. At least three structural elements may therefore be arranged on a distance of approximately 400 μm.

Furthermore, in all the examples at least three structural elements may be arranged successively in the flow direction, a structural element having a distance from the neighboring structural element greater than 20 μm. At least three structural elements may therefore be arranged on a distance of approximately 40 μm. The size of the rounding radii may in all the examples be greater than an average roughness of the material in which the structural element is formed.

Our arrangements and methods have been illustrated and described in detail with the aid of preferred examples. This disclosure is not, however, restricted to the examples. Rather, other variants may be derived therefrom by those skilled in the art without departing from the protective scope of the appended claims.

This application claims priority of DE 10 2016 116 298.1, the subject matter of which is incorporated herein by reference.

The invention claimed is:

1. An arrangement comprising:
a carrier;
an optoelectronic component arranged on the carrier; and
a material arranged on the carrier,
wherein the carrier comprises at least one structural element,
at least a part of the material is arranged between the optoelectronic component and the structural element,
wherein the structural element hinders flow of the material in a flow direction away from the optoelectronic component,
the structural element extends transversely to the flow direction,
the structural element has a rounding radius in a plane perpendicular to the transverse extent of the structural element less than 20 μm,
at least a first and a second structural element are arranged successively in the flow direction,
the first structural element is an elevation starting from a surface of the carrier and the second structural element is a depression starting from the surface of the carrier,
adjacent side faces of the first and second structural element have a distance greater than 5 μm, and
the structural elements have a rounding radius in a plane perpendicular to the transverse extent of the structural element less than 20 μm.

2. The arrangement as claimed in claim 1, wherein at least three structural elements are arranged successively in the flow direction, and a structural element has a distance from the neighboring structural element less than 200 μm.

3. The arrangement as claimed in claim 1, wherein at least three structural elements are arranged successively in the flow direction, and a structural element has a distance from the neighboring structural element greater than 5 μm.

4. The arrangement as claimed in claim 1, wherein the rounding radius is less than 10 μm or the rounding radius is less than 1 μm.

5. The arrangement as claimed in claim 1, wherein the height of the structural element is less than 20 μm and the structural element has a height of at least 0.05 μm.

6. The arrangement as claimed in claim 1, wherein the carrier comprises an electrically conductive layer for electrical contacting of the component, the structural element is arranged in a surface of the electrically conductive layer, a surface of the conductive layer has an average roughness, and the radius of the structural element is greater than the average roughness of the surface of the conductive layer.

7. The arrangement as claimed in claim 1, further comprising a limiting element arranged on the carrier next to the component, wherein the limiting element is configured in the form of a web, the limiting element is made of plastic material or epoxy resin or silicone, the material is arranged between the component and a first side of the limiting element, and the structural element is arranged adjacent to a second side of the limiting element, and the second side is arranged opposite to the first side.

8. The arrangement as claimed in claim 1, wherein in a first region of the carrier several structural elements are arranged in the form of depressions in the carrier, the depressions of the structural elements have a rounded or circular cross-sectional area in a cross section through a plane parallel to a surface of the carrier, and the structural elements have a rounding radius in a plane perpendicular to the transverse extent of the structural element less than 20 μm.

9. A method of producing an arrangement having a carrier, comprising:
providing the carrier;
introducing at least one structural element that hinders flow of a material in a predetermined flow direction into the carrier, wherein the structural element extends transversely to the flow direction, and the structural element has a rounding radius in a plane perpendicular to the transverse extent of the structural element less than 20 µm;
arranging an optoelectronic component on the carrier next to the structural element;
applying the material onto at least one of the component and between the component and the structural element; and
applying an electrically conductive layer for electrical contacting of the component onto the carrier, wherein the structural element is introduced into a surface of the carrier before the application of the electrically conductive layer, and the electrical conductive layer is applied on the surface of the carrier such that a surface of the electrically conductive layer comprises a structural element.

10. The method as claimed in claim 9, wherein the structural element is produced by at least one of a grinding method, a laser processing method, a mechanical scoring method, and a sandblasting method.

11. The method as claimed in claim 9, further comprising applying an electrically conductive layer for electrical contacting of the component onto a surface of the carrier, wherein the structural element is formed in a surface of the electrically conductive layer, and introduced into the electrically conductive layer after application of the electrically conductive layer onto the surface of the carrier.

12. An arrangement comprising:
a carrier;
an optoelectronic component arranged on the carrier; and
a material arranged on the carrier and on the optoelectronic component,
wherein the carrier comprises at least one structural element that hinders flow of the material in a flow direction away from the optoelectronic component,
the structural element extends transversely to the flow direction, and
the structural element has a rounding radius in a plane perpendicular to the transverse extent of the structural element less than 20 µm,
the carrier comprises an electrically conductive layer for electrical contacting of the optoelectronic component,
the structural element is arranged in the electrically conductive layer as an elevation of the electrically conductive layer,
a surface of the conductive layer has an average roughness,
the radius of the structural element is greater than the average roughness of the surface of the conductive layer;
a limiting element is arranged between the optoelectronic component and the structural element on the electrically conductive layer,
the limiting element is configured in the form of a web or a wall,
the limiting element extends over at least a part of a side length of the optoelectronic component,
the limiting element limits a flow path of the material, and
the limiting element is made of plastic material or epoxy resin or silicone.

13. The arrangement of claim 12, wherein the electrically conductive layer is arranged on a surface of the carrier forming a double layer structure,
the optoelectronic component is arranged on the electrically conductive layer on top of the double layer structure opposite to the surface of the carrier,
the electrically conductive layer starts from the optoelectronic component and extends along the surface of the carrier to a contact region,
the contact region is arranged with a distance from the optoelectronic component, and
the structural element is arranged between the optoelectronic component and the contact region of the electrically conductive layer.

14. The arrangement as claimed in claim 12, wherein the height of the structural element is less than 20 µm and the structural element has a height of at least 0.05 µm.

15. The arrangement as claimed in claim 12, wherein at least a first and a second structural element are arranged in the electrically conductive layer successively in the flow direction,
the first and the second structural element have the shape of an elevation,
the first and second structural element have a distance more than 5 µm, and
the structural elements have a rounding radius in a plane perpendicular to the transverse extent of the structural element less than 20 µm.

16. An arrangement comprising:
a carrier:
an optoelectronic component arranged on the carrier; and
a material arranged on the carrier and on the optoelectronic component,
wherein the carrier comprises at least one structural element that hinders flow of the material in a flow direction away from the optoelectronic component,
the structural element extends transversely to the flow direction, and
the structural element has a rounding radius in a plane perpendicular to the transverse extent of the structural element less than 20 µm,
the carrier comprises an electrically conductive layer for electrical contacting of the optoelectronic component,
the structural element is arranged in the electrically conductive layer as an elevation of the electrically conductive layer,
a surface of the conductive layer has an average roughness,
the radius of the structural element is greater than the average roughness of the surface of the conductive layer,
at least a first and a second structural element are arranged in the electrically conductive layer successively in the flow direction,
the first structural element is an elevation and the second structural element is a depression,
the first and second structural element have a distance more than 5 µm, and
the structural elements have a rounding radius in a plane perpendicular to the transverse extent of the structural element less than 20 µm.

* * * * *